US012340981B2

(12) United States Patent
Long et al.

(10) Patent No.: US 12,340,981 B2
(45) Date of Patent: Jun. 24, 2025

(54) WORKPIECE PROCESSING APPARATUS WITH OUTER GAS CHANNEL INSERT

(71) Applicants: Mattson Technology, Inc., Fremont, CA (US); Beijing E-Town Semiconductor Technology Co., Ltd., Beijing (CN)

(72) Inventors: Maolin Long, Santa Clara, CA (US); Weimin Zeng, Santa Jose, CA (US)

(73) Assignees: Beijing E-Town Semiconductor Technology Co., Ltd., Beijing (CN); Mattson Technology, Inc., Fremont, CA (US)

(*) Notice: Subject to any disclaimer, the term of this patent is extended or adjusted under 35 U.S.C. 154(b) by 430 days.

(21) Appl. No.: 17/546,506

(22) Filed: Dec. 9, 2021

(65) Prior Publication Data

US 2022/0208523 A1 Jun. 30, 2022

Related U.S. Application Data

(60) Provisional application No. 63/217,559, filed on Jul. 1, 2021, provisional application No. 63/132,530, filed on Dec. 31, 2020.

(51) Int. Cl.
*H01J 37/32* (2006.01)
*H01L 21/263* (2006.01)

(52) U.S. Cl.
CPC .. *H01J 37/32449* (2013.01); *H01J 37/32651* (2013.01); *H01L 21/263* (2013.01); *H01J 2237/334* (2013.01)

(58) Field of Classification Search
CPC .................................................. H01L 21/263
See application file for complete search history.

(56) References Cited

U.S. PATENT DOCUMENTS

| | | | |
|---|---|---|---|
| 6,486,081 B1 * | 11/2002 | Ishikawa | C23C 16/45578 438/789 |
| 7,252,716 B2 | 8/2007 | Kim et al. | |
| 7,722,737 B2 | 5/2010 | Gondhalekar et al. | |
| 8,512,509 B2 | 8/2013 | Bera et al. | |

(Continued)

FOREIGN PATENT DOCUMENTS

| | | |
|---|---|---|
| CN | 1330507 A | 1/2002 |
| CN | 110301030 A | 10/2019 |

*Primary Examiner* — William A Harriston
(74) *Attorney, Agent, or Firm* — Dority & Manning, P.A.

(57) ABSTRACT

A gas injection assembly for injecting gas into a processing chamber is provided. In some examples, the gas injection assembly can include an inlet for receiving a gas flow. The gas injection assembly can include a plurality of gas feed ports for distributing the gas flow received from the inlet. The gas injection assembly can include a plurality of sub-channels vertically arranged inside of the gas injection assembly, including: an upper subchannel for receiving the gas flow from the inlet and subdividing the gas flow into a set of orifices to form a first gas flow branch and a second gas flow branch, the first gas flow branch corresponding to a first portion of the gas flow passing through a first subset of the set of orifices and the second gas flow branch corresponding to a second portion of the gas flow passing through a second subset of the set of orifices; and a plurality of outlet subchannels for subdividing the gas flow into the plurality of gas feed ports.

19 Claims, 7 Drawing Sheets

(56) References Cited

U.S. PATENT DOCUMENTS

| | | | |
|---|---|---|---|
| 10,163,606 B2 | 12/2018 | Rozenzon et al. | |
| 10,366,865 B2 | 7/2019 | Kang et al. | |
| 2004/0099378 A1* | 5/2004 | Kim | C23C 16/4558 156/345.33 |
| 2012/0305190 A1* | 12/2012 | Kang | C23C 16/45563 137/15.01 |
| 2016/0086784 A1* | 3/2016 | Brekenfeld | H01J 49/0422 250/423 R |
| 2019/0145002 A1* | 5/2019 | Um | C23C 16/45557 118/722 |
| 2019/0206657 A1* | 7/2019 | Francesco | H01J 37/32825 |
| 2020/0243305 A1 | 7/2020 | Zeng et al. | |
| 2021/0176831 A1* | 6/2021 | Lei | C23C 16/4586 |

* cited by examiner

WORKPIECE PROCESSING APPARATUS WITH OUTER GAS CHANNEL INSERT

PRIORITY CLAIM

The present application claims the benefit of priority of U.S. Provisional Application Ser. No. 63/132,530, titled "Outer Gas Channel Insert," filed on Dec. 31, 2020, which is incorporated herein by reference. The present application claims the benefit of priority of U.S. Provisional Application Ser. No. 63/217,559, titled "Workpiece Processing Apparatus with Outer Gas Channel Insert," filed on Jul. 1, 2021, which is incorporated herein by reference.

FIELD

The present disclosure relates generally to semiconductor processing equipment, such as equipment operable to inject gas into a processing area of a workpiece processing apparatus.

BACKGROUND

A workpiece processing apparatus can define a processing chamber configured to accommodate a workpiece, such as a semiconductor wafer. Different types of workpiece processing apparatuses (e.g., thermal processing systems and/or plasma processing systems) can perform various treatment processes (e.g., plasma etch, plasma deposition, rapid thermal processing) on the workpiece to modify or otherwise treat it. Certain portions of the workpiece, however, can be affected at different rates when the workpiece is being processed, which can lead to anomalies or other defects associated with the workpiece.

Workpiece processing apparatuses used in modern applications typically use plasma controls or temperature sensors, among other mechanisms, to control process uniformity and/or workpiece uniformity during treatment processes. However, such mechanisms can be ineffective or costly to implement. Accordingly, improved semiconductor processing equipment is needed.

SUMMARY

Aspects and advantages of embodiments of the present disclosure will be set forth in part in the following description, or may be learned from the description, or may be learned through practice of the embodiments.

Aspects of the present disclosure are directed to a a gas injection assembly for injecting gas into a processing chamber. The gas injection assembly can include an inlet for receiving a gas flow. The gas injection assembly can include a plurality of gas feed ports for distributing the gas flow received from the inlet. The gas injection assembly can include a plurality of subchannels vertically arranged inside of the gas injection assembly, including: an upper subchannel for receiving the gas flow from the inlet and subdividing the gas flow into a set of orifices to form a first gas flow branch and a second gas flow branch, the first gas flow branch corresponding to a first portion of the gas flow passing through a first subset of the set of orifices and the second gas flow branch corresponding to a second portion of the gas flow passing through a second subset of the set of orifices; and a plurality of outlet subchannels for subdividing the gas flow into the plurality of gas feed ports.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
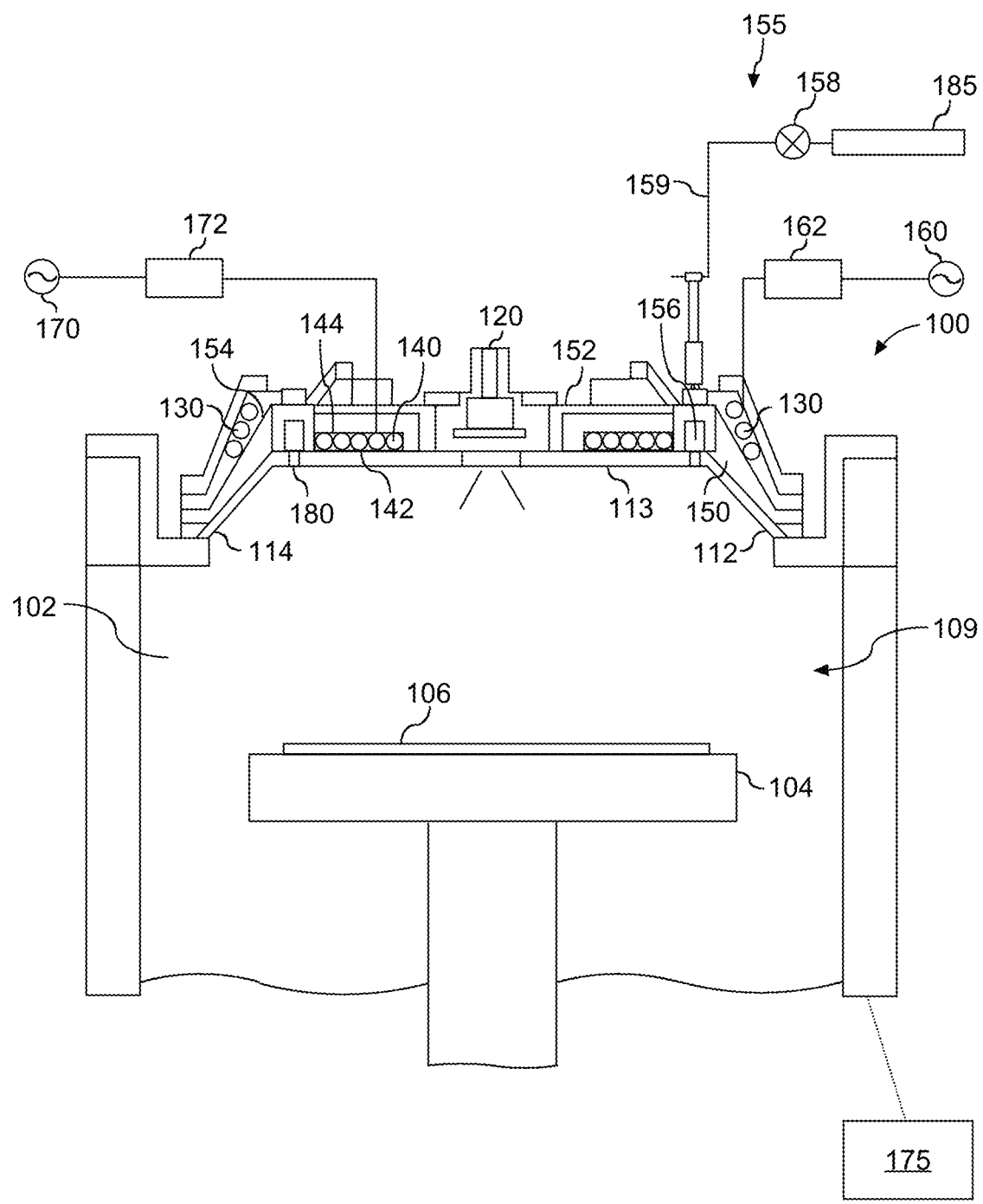
FIG. 1 depicts an example workpiece processing apparatus according to example embodiments of the present disclosure.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor workpiece or other suitable workpiece. In addition, the use of the term "about" in conjunction with a numerical value is intended to refer to within ten percent (10%) of the stated numerical value. A "pedestal" refers to any structure that can be used to support a workpiece. A "remote plasma" refers to a plasma generated remotely from a workpiece, such as in a plasma chamber separated from a workpiece by a separation grid. A "direct plasma" refers to a plasma that is directly exposed to a workpiece, such as a plasma generated in a processing chamber having a pedestal operable to support the workpiece.

As used herein, use of the term "about" in conjunction with a stated numerical value can include a range of values within 10% of the stated numerical value. Additionally, the term "substantially" can be used herein. For example, in embodiments the phrase "substantially parallel" is used regarding the parallel relationship between an upper subchannel and outlet subchannels. In such embodiments, substantially parallel refers to at least within 15 degrees of being parallel, such as within 10 degrees of parallel, such as within 1.0 degrees of parallel.

Workpiece processing apparatuses can generally include a processing chamber for performing various treatment processes on one or more workpieces. Such chambers can include a plasma generation source (e.g., an induction coil)

for carrying out plasma processes or a heating source (e.g., a lamp array) for performing thermal processes. Additionally, such chambers can generally include side walls and a top portion (e.g., a lid) to define a processing region disposed above the workpiece. Furthermore, the chamber can be configured to inject process gas, typically through the side walls and/or lid, into the processing chamber during treatment processes. Accordingly, gas distribution mechanisms can be provided around the interior walls of the chamber or in the lid as a ring insert. However, such gas distribution mechanisms often suffer from many drawbacks, one being a lack of control over the pressure of the gas distributed from the one or more apertures of the mechanism. Additionally, in processing apparatuses where it is desirable to use one or two apertures to deliver gas to the processing area, it can be difficult to provide azimuthal uniformity during treatment processes.

Example aspects of the present disclosure are directed to a gas injection assembly for injecting gas into a processing chamber of a workpiece processing apparatus. The processing apparatus can include a processing chamber having one or more sidewalls and a dome (e.g., dielectric ceiling, dielectric dome). The apparatus includes a workpiece support disposed in the processing chamber configured to support a workpiece during processing and an induction coil assembly for inducing a plasma in the processing chamber. A Faraday shield is disposed between the induction coil assembly and the processing chamber. The apparatus also includes a gas injection assembly configured to inject a gas into the processing chamber with increased uniform distribution across the workpiece and/or increased uniform distribution within the chamber.

Advantageously, a gas injection assembly according to example aspects of the present disclosure can inject gases with improved pressure uniformity and/or conductance uniformity. For instance, in some embodiments, a gas injection assembly can include a gas channel insert that has one or more subchannels for subdividing an input flow (e.g., gas flow) into one or more output flows while facilitating the equalization (e.g., pressure and/or flow equalization) of the one or more output flows. In this manner, the output flows can improve uniformity in the distribution of process gas and in the application of treatment processes applied on a workpiece. For instance, in some embodiments, a gas injection assembly can facilitate substantially equal gas conductance for all output flows into the process chamber. The rate at which the workpiece is processed becomes more uniform, leading to a reduction in anomalies and other defects associated with the workpiece.

In some embodiments, a gas channel of a process apparatus comprises one gas inlet. In some embodiments, the gas channel may comprise two inlets configured to receive a gas flow from a dual feed gas line. A gas channel insert according to example aspects of the present disclosure can be inserted into the gas channel defined in a lid of the processing apparatus in order to redirect the flow from the one inlet toward a plurality of gas feed ports. For instance, a gas channel insert can provide for at least double, quadruple, or octuple the number of gas feed ports as compared to the number of inlets. In some embodiments, a gas channel may comprise one or two inlets, and a gas channel insert provided therein may provide up to sixteen gas feed ports, or up to thirty-two gas feed ports, or up to sixty-four gas feed ports, or more.

Example aspects of the present disclosure relate to a gas injection assembly for injecting gas into a processing chamber. The gas injection assembly comprises a plurality of gas feed ports for distributing a gas flow received by an inlet of the gas injection assembly. Further, a plurality of vertically arranged subchannels can subdivide the gas flow as it passes from an upper subchannel to a plurality of outlet subchannels. In some embodiments, each outlet subchannel of the plurality of outlet subchannels is disposed proximate to at least one gas feed port of the plurality of gas feed ports for distributing the gas flow into an interior space of the processing chamber.

Example aspects of the present disclosure can provide a number of technical effects and benefits. For example, the gas channel insert includes one or more gas flow branches in order to evenly distribute a gas flow as it passes from a single inlet to a plurality of gas feed ports. In such configurations, the plurality of gas feed ports can be formed annularly around a lid of a processing chamber such that the gas flow is injected into the processing chamber in a manner that improves azimuthal uniformity. Additionally, due to the subdividing nature of the one or more gas flow branches, the gas feed ports can inject the gas flow into a processing chamber with improved pressure uniformity and/or conductance uniformity. Without the gas flow branches, the gas pressure would differ with respect to an outlet located proximate the inlet relative to an outlet located further from the inlet.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

FIG. 1 depicts a processing apparatus 100 according to example embodiments of the present disclosure. Aspects of the present disclosure are discussed with reference to the processing apparatus 100 depicted in FIG. 1 for purposes of illustration and discussion. Those of ordinary skill in the art, using the disclosures provided herein, will understand that example aspects of the present disclosure can be used with other processing tools and/or apparatus without deviating from the scope of the present disclosure, such as plasma strip tools, thermal processing tools, etc. It is to be understood that substrates can comprise, for instance, glass plates, films, ribbons, solar panels, mirrors, liquid crystal displays, semiconductor wafers, and the like. Additionally, it is to be understood that different types of processing chambers are available, for instance, for processing semiconductor wafers during the manufacture of integrated circuit chips. The processing chambers can be used to anneal the wafers, carry out chemical vapor deposition, plasma enhanced chemical vapor deposition, etching processes, and other deposition processes. Those of ordinary skill in the art, using the disclosures provided herein, will understand that example aspects of the present disclosure can be used for other processing chambers not explicitly discussed with reference to the figures in the present disclosure.

As shown in FIG. 1, the processing apparatus 100 includes a processing chamber 109 defining an interior space 102. A workpiece support 104 (e.g., pedestal) is used to support a workpiece 106, such as a semiconductor wafer, within the interior space 102. Workpiece support 104 can include one or more support pins, such as at least three support pins, extending from workpiece support 104. (Not shown). In some embodiments, the workpiece support 104 can include an electrostatic chuck. In some embodiments, workpiece support 104 can be spaced from the top of the processing chamber 109, such as spaced from dome 112 (e.g., dielectric ceiling, dielectric dome). A dome 112 is located above the workpiece support 104. The processing chamber 109 includes one or more sidewalls 111 and a dome 112. The dome 112 can include a relatively flat central portion 113 and an angled peripheral portion 114. While such embodiments of a dome 112 are disclosed, the dome 112 can be any suitable shape. For example, in certain embodiments the dome 112 may be formed from a relatively flat portion with no angled peripheral portions. In certain other embodiments, the dome 112 can be in the shape of a sphere. Any suitable dome shape can be used according to the disclosure provided. The dome 112 includes a space in the central portion 113 for a showerhead 120 to feed process gas into the interior space 102. Additionally, gas feed ports 180 can extend through the dome 112 to allow for the passage of a gas flow from a gas channel 156 to the interior space 102 of the processing chamber 109.

As shown in FIG. 1, according to example aspects of the present disclosure, the processing apparatus 100 can include a gas delivery system 155 configured to deliver process gas to the processing chamber 109, for instance, via a gas channel 156 defined between the dome 112 and a metal shield 152 and/or unitary body 150, formed by the metal shield 152 and a Faraday shield 154. The gas delivery system 155 can include one or more feed gas lines 159. The feed gas lines 159 can deliver a desired amount of gases into the processing chamber 109 as process gas. The gas delivery system 155 can be used for the delivery of any suitable process gas. Example process gases include, for instance, oxygen-containing gases (e.g. $O_2$, $O_3$, $N_2O$, $H_2O$), hydrogen-containing gases (e.g., $H_2$, $D_2$), nitrogen-containing gas (e.g. $N_2$, $NH_3$, $N_2O$), fluorine-containing gases (e.g. $CF_4$, $C_2F_4$, $CHF_3$, $CH_2F_2$, $CH_3F$, $SF_6$, $NF_3$), hydrocarbon-containing gases (e.g. $CH_4$), or combinations thereof. Other feed gas lines containing other gases can be added as needed. For instance, dual feed lines can be used to deliver gas to the gas channel at more than one inlet location. In some embodiments, the process gas can be mixed with an inert gas that can be called a "carrier" gas, such as He, Ar, Ne, Xe, or $N_2$. A control valve 158 can be used to control a flow rate of each feed gas line to flow a process gas into the processing chamber 109. In embodiments, the gas delivery system 155 can be controlled with a gas flow controller 185.

In embodiments, the processing apparatus 100 can include a controller 175. The controller 175 controls various components in processing chamber 109 during a treatment process. For example, the controller 175 can implement one or more process parameters, such as controlling the gas flow controllers 185, and altering conditions of the processing chamber 109, such as controlling gas pressure, in order to maintain suitable conditions in the processing chamber 109 while the workpiece 106 is processed. The controller 175 can include, for instance, one or more processors and one or more memory devices. The one or more memory devices can store computer-readable instructions that, when executed by the one or more processors, cause the one or more processors to perform operations, such as any of the control operations described herein.

According to example aspects of the present disclosure, the processing apparatus 100 includes a Faraday shield 154 disposed between a primary induction coil 130 and the processing chamber 109. For example, in certain embodiments the processing apparatus 100 includes a Faraday shield 154 disposed between the primary induction coil 130 and the dome 112. Faraday shield 154 can be a slotted metal shield that reduces capacitive coupling between the induction coil 130 and/or secondary induction coil 140 and the interior space 102 of the process chamber. As illustrated, Faraday shield 154 can fit over the angled portion of the dome 112. Portions of the multi-turn coil of the first induction coil 130 can be located adjacent to the Faraday shield 154. Additionally, optional secondary inductive coil 140 can be included as part of an induction coil assembly for generating an inductive plasma in the interior space 102, as will be described in further detail below.

The processing apparatus 100 may include an induction coil assembly including one or more inductive coils for generating an inductive plasma in the interior space 102 of the processing chamber. The inductive coils can include a primary induction coil 130 that when supplied with RF power, induces a plasma in the process gas in the interior space 102 of the processing apparatus 100. For instance, a RF generator 160 can be configured to provide electromagnetic energy through a matching network 162 to the induction coil 130. Further, the first induction coil 130 can be coupled to ground via a capacitor 164. While only one induction coil 130 is shown, the disclosure is not so limited. Indeed, any number of induction coils can be utilized with the processing apparatus 100 provided herein. For example, the processing apparatus 100 can include at least two inductions coils or at least three induction coils. Additional induction coils can be coupled to an RF power source similar to induction coil 130, such as secondary inductive coil 140.

The optional secondary inductive coil 140 can be used for corrective and supportive functions and for improving the stability of the plasma during steady state operation. Since the secondary inductive coil 140 can be used primarily for corrective and supportive functions and improving stability of the plasma during steady state operation, the secondary inductive coil 140 does not have to be coupled to as powerful an RF generator as the first inductive coil 130 and can be designed differently and cost effectively to overcome the difficulties associated with previous designs. As discussed in detail below, the secondary inductive coil 140 can also be operated at a lower frequency, such as at about 2 MHz, allowing the secondary inductive coil 140 to be very compact and to fit in a limited space on top of the dielectric window.

The primary inductive coil 130 and the secondary inductive coil 140 can be operated at different frequencies. The frequencies can be sufficiently different to reduce crosstalk in the plasma between the primary inductive coil 130 and the secondary inductive coil 140. For instance, the frequency applied to the primary inductive coil 130 can be at least about 1.5 times greater than the frequency applied to the secondary inductive coil 140. In some embodiments, the frequency applied to the primary inductive coil 130 can be about 13.56 MHz and the frequency applied to the secondary inductive coil 140 can be in the range of about 1.75 MHz to about 2.15 MHz. Other suitable frequencies can also be used, such as about 400 kHz, about 4 MHz, and about 27 MHz. While the present disclosure is discussed with reference to the primary inductive coil 130 being operated at a higher frequency relative to the secondary inductive coil 140, those of ordinary skill in the art, using the disclosures provided herein, should understand that the secondary inductive coil 140 could be operated at the higher frequency without deviating from the scope of the present disclosure.

The optional secondary inductive coil 140 can include a planar coil 142 and a magnetic flux concentrator 144. The magnetic flux concentrator 144 can be made from a ferrite material. Use of a magnetic flux concentrator with a proper coil can give high plasma coupling and good energy transfer efficiency of the secondary inductive coil 140, and can significantly reduce its coupling to the metal shield 152. Use of a lower frequency, such as about 2 MHz, on the secondary inductive coil 140 can increase skin layer, which also improves plasma heating efficiency.

According to aspects of the present disclosure, the different inductive coils 130 and 140 can carry different functions. Specifically, the primary inductive coil 130 can be used to carry out the basic functions of plasma generation during ignition and provide enough priming for the secondary inductive coil 140. The primary inductive coil 130 can have coupling to both plasma and the grounded shield to stabilize plasma potential. The Faraday shield 154 associated with the first inductive coil 130 avoids window sputtering and can be used to supply the coupling to the ground.

The arrangement of the primary inductive coil 130 and the secondary inductive coil 140 on opposite sides of the metal shield 152 allows the primary inductive coil 130 and secondary inductive coil 140 to have distinct structural configurations and to perform different functions. For instance, the primary inductive coil 130 can include a multi-turn coil located adjacent to a peripheral portion of the process chamber. The primary inductive coil 130 can be used for basic plasma generation and reliable start during the inherently transient ignition stage. The primary inductive coil 130 can be coupled to an RF generator and auto-tuning matching network and can be operated at an increased RF frequency, such as at about 13.56 MHz.

While the present disclosure makes reference to a primary inductive coil 130 and a secondary inductive coil 140, those of ordinary skill in the art, should appreciate that the terms primary and secondary are used for convenience purposes only. The secondary inductive coil 140 can be operated independently of the primary inductive coil 130. In addition, in some embodiments, the processing apparatus may only have a single inductive coupling coil.

According to aspects of the present disclosure, the processing apparatus 100 can include a metal shield 152 disposed around the secondary inductive coil 140. The metal shield 152 separates the primary inductive coil 130 and the secondary inductive coil 140 to reduce cross-talk between the inductive coils 130, 140. Processing apparatus 100 can further include a Faraday shield 154 disposed between the primary inductive coil 130 and the dome 112. The Faraday shield 154 can be a slotted metal shield that reduces capacitive coupling between the primary inductive coil 130 and the processing chamber 109. As illustrated, the Faraday shield 154 can fit over the angled portion of the dielectric shield 110.

Figure 2:
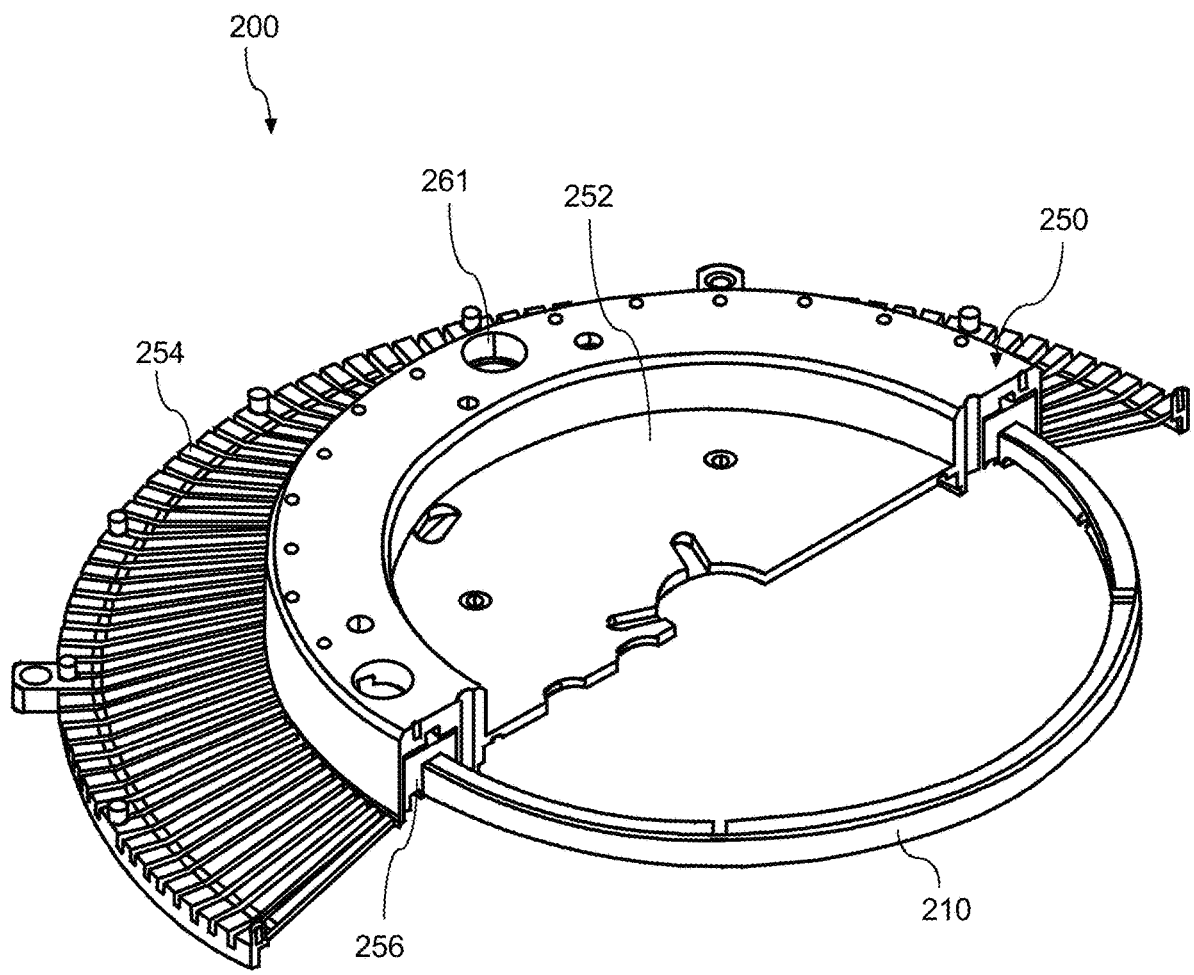
FIG. 2 depicts an example gas injection assembly for a workpiece processing apparatus according to example embodiments of the present disclosure.

FIG. 2 depicts an example gas injection assembly 200 for a workpiece processing apparatus according to example embodiments of the present disclosure. The gas injection assembly 200 includes a gas channel 256 and a first inlet 261 for receiving a gas flow from a first feed gas line. In some embodiments, the gas channel 256 can include a second inlet that receives gas flow from a second feed gas line. The second inlet and first inlet can be located on opposite sides of the gas channel 256.

Figure 4:
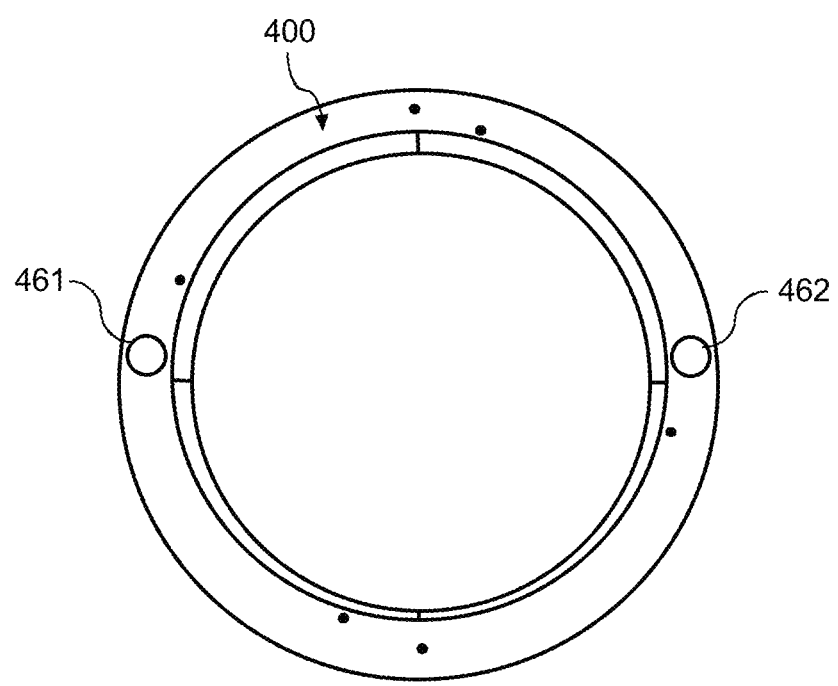
FIG. 4 depicts an example top-down view of a gas channel insert for a processing workpiece apparatus according to example embodiments of the present disclosure.

As depicted in FIG. 4, for instance, an example top-down view of a gas channel insert 400 depicts a first inlet 461 for receiving a gas flow from a first feed gas line and a second inlet 462 for receiving the same gas flow or a different gas flow from a second feed gas line. In some embodiments, the first inlet 461 and the second inlet 462 are configured to deliver the gas flow to an upper subchannel of the gas channel insert 400.

Returning to FIG. 2, the gas injection assembly 200 is partially defined by a metal shield 252 and a Faraday shield 254 of the processing chamber, which can form a unitary body 250. In some embodiments, a gas channel 256 is formed by a portion of the metal shield 252 and/or a portion of the unitary body 250, including the Faraday shield 254. Additionally, a gas channel insert 210 comprising a plurality of subchannels can be positioned in the gas channel 256 to deliver a gas flow into the processing chamber. In this manner, the Faraday shield 254 can define a first portion of the gas injection assembly such that the first portion includes the plurality of subchannels. A bottom portion of the gas channel insert 210 is disposed adjacent to a dielectric window or dome, such as the dome 112 depicted in FIG. 1, which separates the gas channel 256 and/or gas channel insert 210 from the processing chamber. As will be described in further detail below, the dome (e.g., dielectric dome) can define a second portion of the gas injection assembly comprising a plurality of gas feed ports for distributing a gas flow into the processing chamber.

Figure 3:
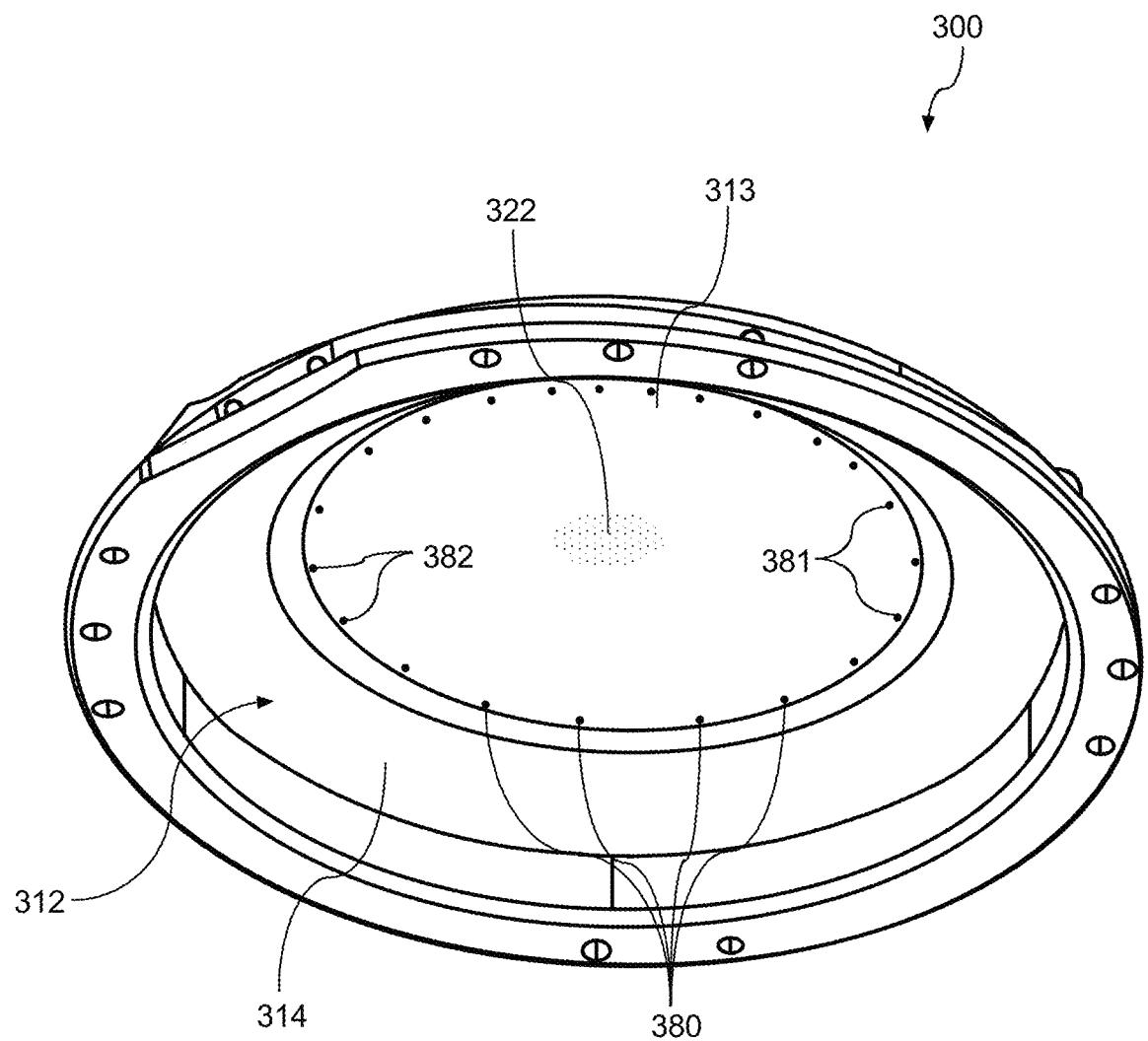
FIG. 3 depicts an example bottom-up view of dome of a gas injection assembly for a workpiece processing apparatus according to example embodiments of the present disclosure.

FIG. 3 depicts an example bottom-up view of a dome 312 of a gas injection assembly 300 for a workpiece processing apparatus according to example embodiments of the present disclosure. The gas injection assembly 300 includes a gas channel insert (not shown) and a dome 312 having a central portion 313 and an angled peripheral portion 314. The central portion 313 includes both central apertures 322 and a plurality of gas feed ports gas feed ports 380.

For instance, the central apertures 322 can extend through the central portion 313 of the dome 312, allowing for the passage of process gas from a showerhead into an interior space of the processing chamber. Furthermore, the plurality of gas feed ports 380 can extend at least partially through the central portion 313 of the dome 312. For instance, a first portion of a gas injection assembly 300 (e.g., the gas channel insert) can be disposed in a gas channel. A second portion of the gas injection assembly (e.g., the plurality of gas feed ports 380) can extend between the first portion of the gas injection assembly 300 and the interior space of the processing chamber. In particular, the plurality of gas feed ports 380 extend in a vertical direction through the dome 312. In some embodiments, the plurality of gas feed ports 380 are formed at a location that is radially distal relative to the central apertures 322. Moreover, the plurality of gas feed ports 380 are configured to distribute a gas flow from one or more inserts of the gas injection assembly 300 into the interior space of the processing chamber. For example, the gas injection assembly 300 can comprise 8, 16, 32, or 64 gas feed ports, or more, which extend through the dome 312 from the first portion of the gas injection assembly (e.g., the gas channel insert) to the interior space of the processing chamber. Furthermore, the plurality of gas feed ports 380 are configured to distribute gas flow from one or more inlets of the gas channel insert toward a workpiece disposed in the interior space of the processing chamber. In this manner, the azimuthal uniformity of treatment processes applied on the workpiece can be increased.

According to aspects of the present disclosure, the plurality of gas feed ports 380 can include a first subset of gas feed ports 381 and a second subset of gas feed ports 382. Each gas feed port of the plurality of gas feed ports 380 can be formed annularly around an outer edge of the central portion 313 of the dome 312. The first subset of gas feed ports 381 can correspond to a first gas flow branch of the gas channel insert and the second subset of gas feed ports 382 can correspond to a second gas flow branch of the gas channel insert.

Figure 5:
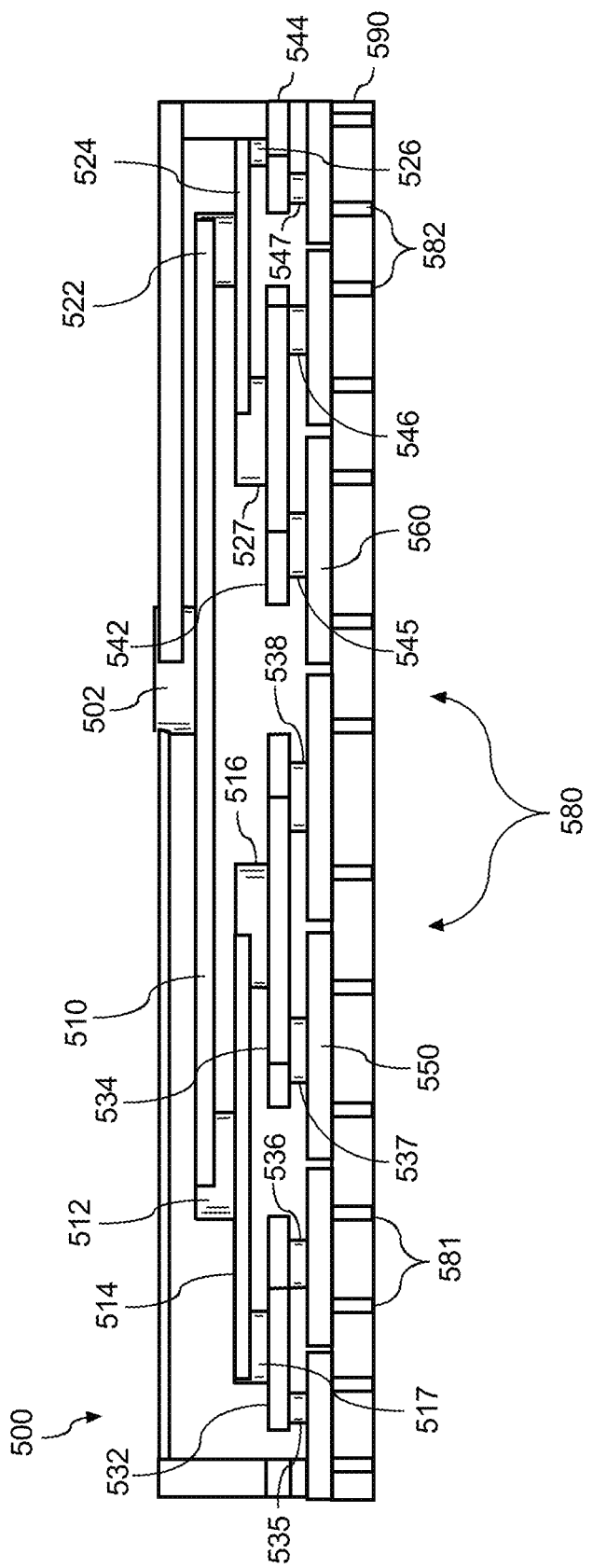
FIG. 5: depicts an example cross-sectional view of a gas channel insert for a workpiece processing apparatus according to example embodiments of the present disclosure.

FIG. 5 depicts an example cross-sectional view of a gas channel insert 500 for a workpiece processing apparatus according to example embodiments of the present disclosure. The gas channel insert 500 can include an inlet 502, such as a first inlet, to receive a gas flow from a first feed gas line, which can be routed to the inlet 502. Additionally, the gas channel insert 500 may include another inlet, such as a second inlet, for receiving gas from a second feed gas line. The gas channel insert 500 also comprises a plurality of subchannels for distributing the gas flow from the inlet 502 to a plurality of gas feed ports 580 included in a dome 590 (e.g., dielectric ceiling, dielectric dome). The gas channel insert 500 and dome 590 can define a gas injection assembly. In some embodiments, the plurality of subchannels may be positioned in a vertical arrangement between the inlet 502 and the plurality of gas feed ports 580. The plurality of subchannels can partially define an interior of the gas channel insert 500 to subdivide the gas flow received by the inlet 502 among a plurality of outlet subchannels, such a first outlet subchannel 550 and a second outlet subchannel 560. For example, the plurality of subchannels of the gas channel insert can be configured to operate as a series of baffles in the gas flow.

According to aspects of the present disclosure, the plurality of subchannels can include an upper subchannel, intermediate subchannels, and outlet subchannels. As depicted in FIG. 5, for example, an upper subchannel 510 is disposed proximate to the inlet 502 such that the gas flow received at the inlet 502 can pass through the upper subchannel 510. The plurality of subchannels further includes a plurality of intermediate subchannels vertically arranged between the upper subchannel 510 and the plurality of outlet subchannels. For instance, the intermediate subchannels include a first primary intermediate subchannel 514 of a first gas flow branch and a second primary intermediate subchannel 524 of a second gas flow branch. The first primary intermediate subchannel 514 is vertically arranged between the upper subchannel 510 and a first outlet subchannel 550. Similarly, the second primary intermediate subchannel 524 is vertically arranged between the upper subchannel 510 and a second outlet subchannel 560. As such, the upper subchannel 510 subdivides the gas flow through the first and second primary intermediate subchannels 514 and 524, respectively, to form a first gas flow branch and a second gas flow branch.

Additionally, the intermediate subchannels can include a plurality of secondary intermediate subchannels. The secondary intermediate subchannels can include a first secondary intermediate subchannel 532 and a second secondary intermediate subchannel 534 associated with the first gas flow branch. Further, the secondary intermediate subchannels can include a third secondary intermediate subchannel 542 and a fourth secondary intermediate subchannel 544 associated with the second gas flow branch. As depicted in FIG. 5, each secondary intermediate subchannel can subdivide the gas flow to outlet subchannels. For instance, the second secondary intermediate subchannel 534 can subdivide the first portion of the gas flow to two outlet subchannels, including first outlet subchannel 550. Likewise, the third secondary intermediate subchannel 542 can subdivide the second portion of the gas flow to two outlet subchannels, including second outlet subchannel 560. The plurality of subchannels is configured to allow for the passage of gas flow via a set of orifices, as will be discussed in further detail below.

According to aspects of the present disclosure, the gas channel insert 500 includes a set of orifices for subdividing the gas flow into the first gas flow branch (e.g., first branch) and the second gas flow branch (e.g., second branch). As depicted in FIG. 5, a first subset of the set of orifices includes a primary orifice, secondary orifices, and tertiary orifices of the first branch. In relation to the second branch, a second subset of the set of orifices also includes a primary orifice, secondary orifices, and tertiary orifices. In particular, the first portion of the gas flow can pass through a first primary orifice 512 to form the first gas flow branch. Additionally, the second portion of the gas flow can pass through a second primary orifice 522 to form the second gas flow branch. In this manner, the secondary orifices and tertiary orifices can further subdivide the gas flow as it passes from the upper subchannel 510 to the plurality of outlet subchannels (e.g., first and second outlet subchannels 550,560).

As depicted in FIG. 5, for example, the first portion of the gas flow can pass from the upper subchannel 510 to the first primary intermediate subchannel 514 through the first primary orifice 512 disposed therebetween. The first portion of the gas flow can be further subdivided as it passes through two secondary orifices 516,517 disposed between the first primary intermediate subchannel 514 and the secondary intermediate subchannels 532,534 of the first branch. For example, the first portion of the gas flow can pass from the first primary intermediate subchannel 514 to the first secondary intermediate subchannel 532 through the first secondary orifice 517. Moreover, the first portion of the gas flow can pass from the first primary intermediate subchannel 514 to the second secondary intermediate subchannel 534 through the second secondary orifice 516. Subsequently, the first and second secondary intermediate subchannels 532, 534 subdivide the first portion of the gas flow among the plurality of outlet subchannels through tertiary outlets of the first branch. Similarly, the third and fourth secondary intermediate subchannels receive gas flow through third and fourth secondary orifices 526,527.

As depicted in FIG. 5, the first portion of the gas flow can pass from secondary intermediate subchannels to a plurality of outlet subchannels, such as first outlet subchannel 550. In particular, first and second tertiary orifices 535,536 facilitate the passage of gas flow from the first secondary intermediate subchannel 532. Similarly, third and fourth tertiary orifices 537,538 facilitate the passage of gas flow from the second secondary intermediate subchannel 534. The third tertiary orifice, for instance, facilitates the passage of gas flow from the second secondary intermediate subchannel 534 to the first outlet subchannel 550. Further, tertiary orifices associated with the second gas flow branch (e.g., tertiary orifices 345, 346, 347) are configured to facilitate the passage of gas flow from the third and fourth secondary intermediate subchannels 542,544 to the plurality of outlet subchannels. For instance, fifth tertiary orifice 545 is configured to facilitate the passage of gas flow from the third secondary intermediate subchannel 542 to the second outlet subchannel 560.

According to aspects of the present disclosure, the plurality of outlet subchannels are configured to subdivide the gas flow among two gas feed ports of the plurality of gas feed ports 580. The plurality of gas feed ports can include a first subset of gas feed ports 581 and a second subset of gas feed ports 582, both of which extend through a dome 590 (e.g., dielectric ceiling, dielectric dome). For instance, the first gas flow branch includes the first outlet subchannel 550 which is configured to subdivide the gas flow into two gas feed ports of the first subset of gas feed ports 581. Similarly, the second gas flow branch includes the second outlet subchannel 560 which is configured to subdivide the gas flow into two gas feed ports of a second subset of gas feed ports 382. In some embodiments, the first subset of gas feed ports can comprise eight, sixteen, or thirty-two gas feed ports and the second subset of gas feed ports can comprise eight, sixteen, or thirty-two gas feed ports. In this manner, the plurality of gas feed ports can comprise sixteen, thirty-two, or sixty-four gas feed ports total. The bifurcation of gas flow helps to evenly distribute the gas flow and allows each of the plurality of gas feed ports 580 to provide a gas flow with improved pressure and/or conductance uniformity.

As depicted in FIG. 5, the plurality of outlet subchannels are disposed proximate to the plurality of gas feed ports 580. In some embodiments, a first portion of the gas flow passes through the first primary orifice 512 and is subdivided through intermediate subchannels associated with the first gas flow branch until it is distributed through the first subset of gas feed ports 581. The first subset of gas feed ports 581 deliver the first portion of the gas flow into an interior space of a processing chamber and/or onto the workpiece disposed inside of the processing chamber. Accordingly, the first gas flow branch facilitates uniform pressure in the first portion of the gas flow distributed from the first subset of gas feed ports 581. Likewise, a second portion of the gas flow passes through the second primary orifice 522 and is subdivided through intermediate subchannels associated with the second gas flow branch until it is distributed through the second subset of gas feed ports 582. The second subset of gas feed ports 582 deliver the second portion of the gas flow in an interior space of a processing chamber and/or onto the workpiece disposed inside of the processing chamber. Accordingly, the second gas flow branch facilitates uniform pressure in the second portion of the gas flow distributed from the second subset of gas feed ports 582. The gas flow can be subdivided two, four, six, or more times depending on the number of intermediate subchannels included in the gas channel insert 500.

According to aspects of the present disclosure, the plurality of gas feed ports 580 can extend vertically between the plurality of subchannels and the interior space of the processing chamber. With reference to FIG. 5, for example, the first subset of gas feed ports 581 extends vertically between the first outlet subchannel 550 and the interior space of the processing chamber. As such, the first subset of gas feed ports 581 can extend in a vertical direction that is substantially perpendicular to the plurality of subchannels. In this manner, the plurality of gas feed ports 580 are able to inject the gas flow in a downward, vertical direction into the processing chamber.

Figure 6:
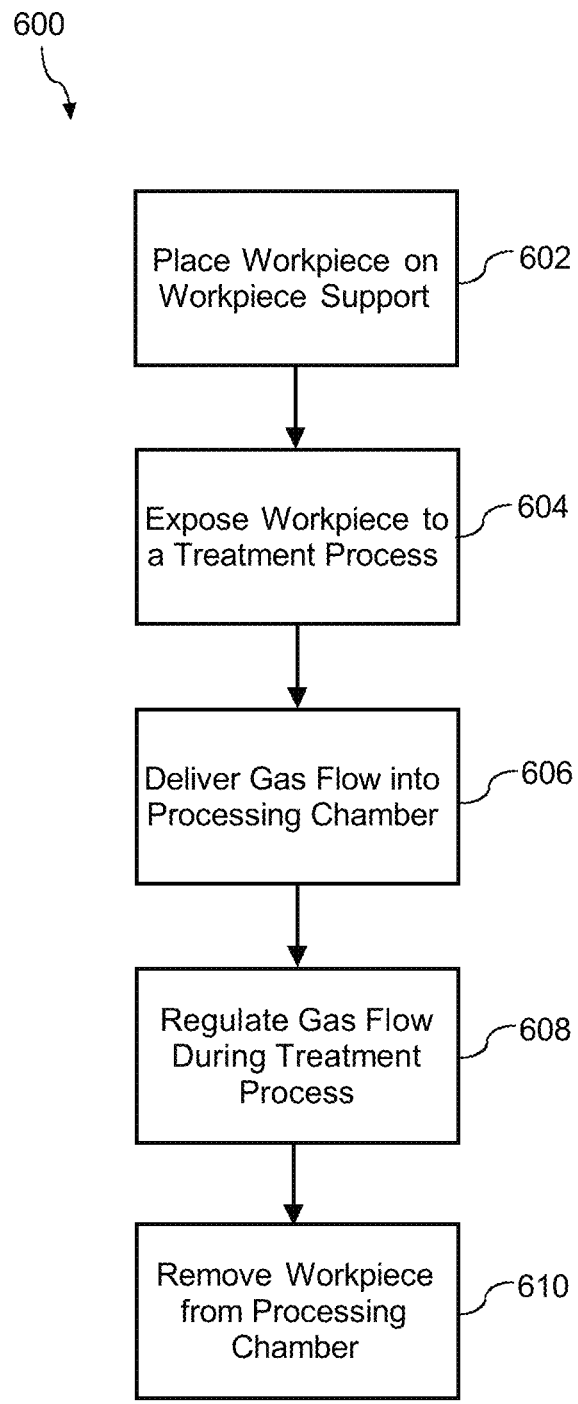
FIG. 6 depicts a flow chart diagram of a method for distributing gas flow according to example embodiments of the present disclosure.

FIG. 6 depicts a flow chart diagram of a method (600) for distributing gas flow according to example embodiments of the present disclosure. The method (600) will be discussed with reference to the processing apparatus 100 of FIG. 1 by way of example. The method (600) can be implemented in any suitable processing apparatus, such as a plasma processing apparatus. FIG. 5 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (602), the method can include placing a workpiece 106 in the processing chamber 109 of a processing apparatus 100. For instance, the workpiece 106 can be placed on a workpiece support 104 disposed in the processing chamber 109.

At (604), the method can include exposing the workpiece 106 to a treatment process. As discussed, the present disclosure can be used in different types of workpiece processing apparatuses, such a plasma processing apparatus, a plasma strip tool, a thermal processing tool, and more. Additionally, the processing chamber can be used to apply a variety of treatment processes, such as chemical vapor deposition, plasma enhanced chemical vapor deposition, other deposition processes, etching processes, and heat treatment processes. During the application of a treatment process, however, it is possible for anomalies in the workpiece to develop due to a non-uniform application of the treatment process on the workpiece.

At (606), the method can include delivering a gas flow into an interior space of the processing chamber. As previously discussed, a gas channel insert can be provided in a gas channel 156 to facilitate the distribution of a gas flow into the processing chamber 109. For example, a feed gas line 159 can deliver a gas flow through an inlet of a gas channel insert. The gas channel insert can include a plurality of subchannels for distributing the gas flow from the insert to a plurality of gas feed ports 180. The gas channel insert can be configured to improve process uniformity and azimuthal uniformity associated with the treatment process applied on the workpiece.

At (608), the method can include regulating the gas flow during the treatment process. For example, the processing apparatus 100 can include a controller 175 for regulating various components in processing chamber 109 during a treatment process. Additionally, the controller 175 can implement one or more process parameters, such as controlling gas flow controllers 185, and altering conditions of the processing chamber 109, such as increasing gas pressure, in order to maintain suitable conditions in the processing chamber 109 while the workpiece 106 is processed. The controller 175 can include, for instance, one or more processors and one or more memory devices for storing computer-readable instructions that, when executed by the one or more processors, cause the one or more processors to perform operations.

At (610), the method can include removing the workpiece from the processing chamber 109. For instance, the workpiece 106 can be removed from workpiece support 104 in the processing chamber 109. The processing apparatus 100 can then be conditioned for future processing of additional workpieces.

Figure 7:
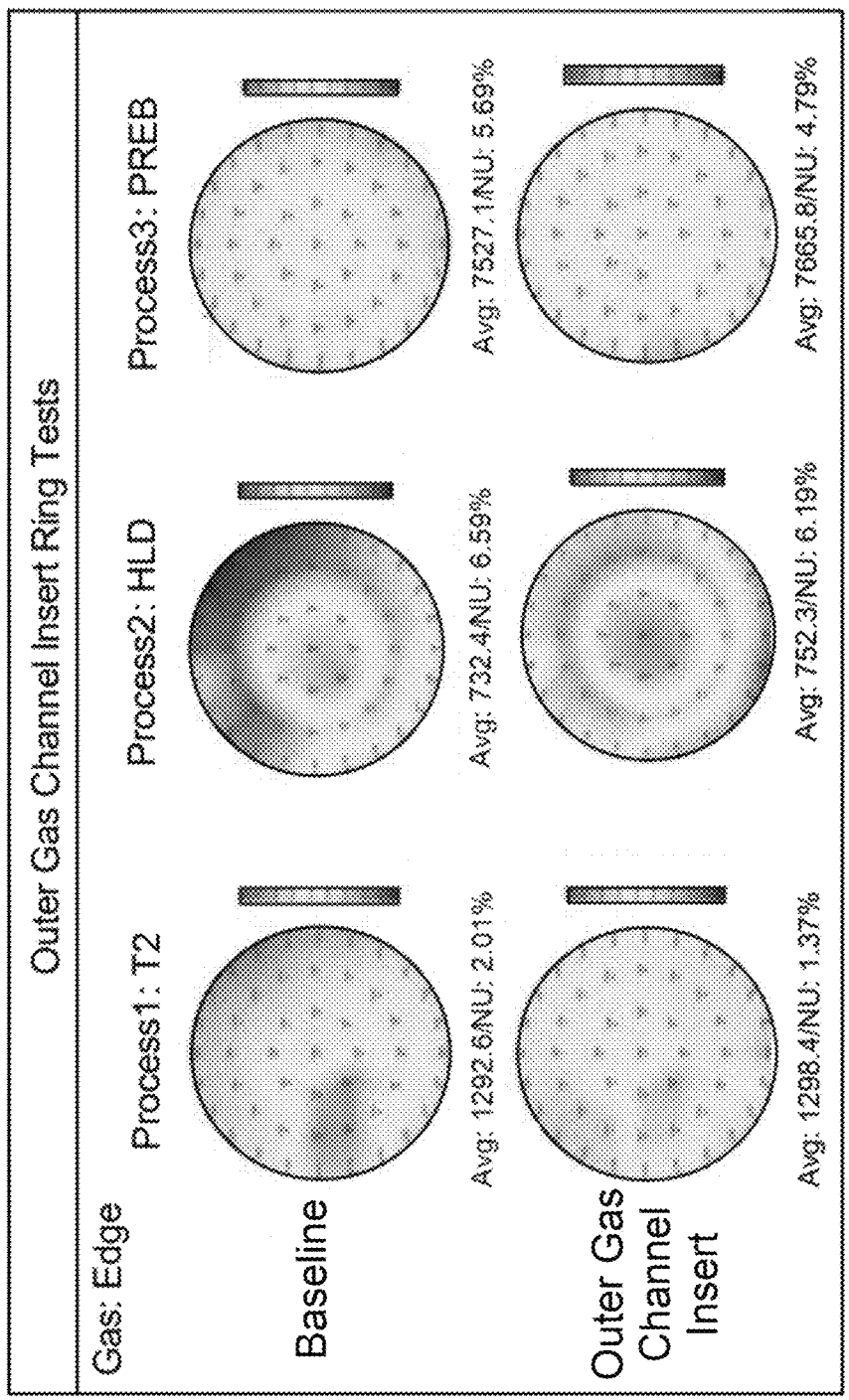
FIG. 7 depicts an example comparison of etch rates during treatment of a workpiece according to example embodiments of the present disclosure.

FIG. 7 depicts an example comparison of etch rates during workpiece treatment processes according to example embodiments of the present disclosure. In this example, test treatment processes used pressures of 10-20 milliTorr and a gas flow rate of 90-500 standard cubic centimeters per minute. Power was varied from 100 W to 1500 W. The tests were conducted using a workpiece processing apparatus where the gas channel insert was not included and where the gas channel insert was included. Accordingly, the etch rates associated with a workpiece were compared based on whether the gas channel insert was included. As can be seen, the test example that used the gas channel insert provided improved uniformity in etch rate as compared to the baseline. The baseline included a single gas channel being fed by two inlets and outputting directly into the process chamber.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A gas injection assembly for injecting gas into a processing chamber, the gas injection assembly comprising:
    an inlet for receiving a gas flow;
    a plurality of gas feed ports for distributing the gas flow received from the inlet; and
    a plurality of subchannels vertically arranged inside of the gas injection assembly, including:
        an upper subchannel for receiving the gas flow from the inlet and subdividing the gas flow into a set of orifices to form a first gas flow branch and a second gas flow branch, the first gas flow branch corresponding to a first portion of the gas flow passing through a first subset of the set of orifices and the second gas flow branch corresponding to a second portion of the gas flow passing through a second subset of the set of orifices;
    a plurality of outlet subchannels for subdividing the gas flow into the plurality of gas feed ports, wherein:
    a Faraday shield of the processing chamber defines a first portion of the gas injection assembly, the first portion comprising the plurality of subchannels; and
    a dielectric dome of the processing chamber defines a second portion of the gas injection assembly, the second portion comprising the plurality of gas feed ports.

2. The gas injection assembly of claim 1, wherein the plurality of outlet subchannels comprises:
    a first outlet subchannel subdividing the first gas flow branch into a first subset of gas feed ports of the plurality of gas feed ports; and
    a second outlet subchannel subdividing the second gas flow branch into a second subset of gas feed ports of the plurality of gas feed ports.

3. The gas injection assembly of claim 2, wherein the plurality of subchannels comprises:
    a plurality of intermediate subchannels vertically arranged between the upper subchannel and the plurality of outlet subchannels.

4. The gas injection assembly of claim 3, wherein:
    the plurality of intermediate subchannels include a first primary intermediate subchannel of the first gas flow branch and a second primary intermediate subchannel of the second gas flow branch;
    the first primary intermediate subchannel is vertically arranged between the upper subchannel and the first outlet subchannel; and
    the second primary intermediate subchannel is vertically arranged between the upper subchannel and the second outlet subchannel.

5. The gas injection assembly of claim 4, wherein:
    the first subset of the set of orifices includes a first primary orifice and a second primary orifice;
    the first primary orifice is disposed between the first primary intermediate subchannel and the upper subchannel; and
    the second primary orifice is disposed between the second primary intermediate subchannel and the upper subchannel.

6. The gas injection assembly of claim 2, wherein the plurality of gas feed ports extends in a vertical direction, the vertical direction being substantially perpendicular to the plurality of subchannels.

7. The gas injection assembly of claim 2, wherein the upper subchannel is substantially parallel to the first outlet subchannel and the second outlet subchannel.

8. The gas injection assembly of claim 2, wherein:
    the first subset of gas feed ports is configured to distribute the first portion of the gas flow in a vertical direction into the processing chamber; and
    the second subset of gas feed ports is configured to distribute the second portion of the gas flow in the vertical direction into the processing chamber.

9. The gas injection assembly of claim 2, wherein:
    the first gas flow branch is configured to facilitate uniform pressure in the first portion of the gas flow distributed from the first subset of gas feed ports; and
    the second gas flow branch is configured to facilitate uniform pressure in the second portion of the gas flow distributed from the second subset of gas feed ports.

10. The gas injection assembly of claim 1, wherein the plurality of subchannels is configured to operate as a series of baffles.

11. The gas injection assembly of claim 1, wherein the plurality of gas feed ports includes at least sixteen gas feed ports for distributing the gas flow received from the inlet into the process chamber.

12. The gas injection assembly of claim 1, wherein the plurality of gas feed ports includes at least thirty-two gas feed ports for distributing the gas flow received from the inlet into the process chamber.

13. A plasma processing apparatus, comprising:
    a processing chamber having one or more sidewalls and a dome, wherein the dome includes a plurality of gas feed ports;
    a workpiece support disposed in the processing chamber configured to support a workpiece during processing;
    an induction coil assembly for inducing a plasma in the processing chamber;
    a Faraday shield disposed between the induction coil assembly and the processing chamber; and
    a gas channel insert comprising:
        an inlet for receiving a gas flow;
        an upper subchannel for receiving the gas flow from the inlet and subdividing the gas flow into a set of orifices to form a first gas flow branch and a second gas flow branch;
        a first outlet subchannel for receiving the first gas flow branch and subdividing the first gas flow branch into a first subset of gas feed ports of the plurality of gas feed ports;
        a second outlet subchannel for receiving the second gas flow branch and subdividing the second gas flow branch into a second subset of gas feed ports of the plurality of gas feed ports.

14. The plasma processing apparatus of claim 13, wherein:
    the gas channel insert is disposed in a gas channel defined between the dome and the Faraday shield; and
    the plurality of gas feed ports extends through the dome.

15. The plasma processing apparatus of claim 13, comprising a dual feed gas line configured to deliver gas to the inlet of the gas channel insert.

16. The plasma processing apparatus of claim 13, wherein:
the first gas flow branch includes a plurality of intermediate subchannels through which a first portion of the gas flow passes to the first outlet subchannel and a second portion of the gas flow passes to the second outlet subchannel.

17. A method for processing a workpiece in a plasma processing apparatus, the processing apparatus including a Faraday shield and a processing chamber having a dome, and a gas channel insert disposed between the dome and the Faraday shield, the method comprising:
placing a workpiece on a workpiece support disposed in the processing chamber;
delivering a gas flow from a feed gas line to an inlet of the gas channel insert, the gas channel insert having a first branch and a second branch;
passing a first portion of the gas flow through the first branch and a second portion of the gas flow through the second branch;
distributing the gas flow into the processing chamber through a plurality of gas feed ports extending through the dome; and
exposing the workpiece disposed in the processing chamber to the gas flow distributed from the gas channel insert;
wherein the gas channel insert includes a plurality of subchannels vertically arranged between the Faraday shield and the dome for passing the gas flow received from an inlet of the gas channel insert.

18. The method of claim 17, wherein:
the first portion of the gas flow and the second portion of the gas flow are distributed into the processing chamber through the plurality of gas feed ports, the plurality of gas feed ports being configured to facilitate pressure uniformity in the gas flow distributed into the processing chamber during processing of the workpiece.

19. The method of claim 17, wherein:
the gas flow is delivered from the feed gas line at a gas flow rate ranging between 90 to 500 standard cubic centimeters per minute.

* * * * *